(12) United States Patent
Yoo et al.

(10) Patent No.: US 12,301,043 B2
(45) Date of Patent: May 13, 2025

(54) SUBSTATION INCLUDING ENERGY STORAGE SYSTEM, METHOD FOR ASSESSMENT OF CAPACITY OF THE SAME AND APPARATUS THEREFOR

(71) Applicant: Korea University Research and Business Foundation, Seoul (KR)

(72) Inventors: Yeuntae Yoo, Suwon-si (KR); Gilsoo Jang, Seoul (KR); Seungmin Jung, Seoul (KR); Sungwoo Kang, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 395 days.

(21) Appl. No.: 17/873,581

(22) Filed: Jul. 26, 2022

(65) Prior Publication Data
US 2023/0027428 A1 Jan. 26, 2023

(30) Foreign Application Priority Data
Jul. 26, 2021 (KR) .......... 10-2021-0097947

(51) Int. Cl.
*H02J 7/00* (2006.01)
*G01R 31/382* (2019.01)

(52) U.S. Cl.
CPC ........ *H02J 7/00712* (2020.01); *G01R 31/382* (2019.01); *H02J 7/0048* (2020.01); *H02J 2300/22* (2020.01); *H02J 2300/28* (2020.01)

(58) Field of Classification Search
CPC .. H02J 7/00712; H02J 7/0048; H02J 2300/22; H02J 2300/28; H02J 3/32;
(Continued)

(56) References Cited

U.S. PATENT DOCUMENTS

| 2013/0268463 A1* | 10/2013 | Arya | .............. G06Q 50/06 705/400 |
| 2015/0330365 A1* | 11/2015 | Deb | .............. F03D 9/257 700/287 |

(Continued)

FOREIGN PATENT DOCUMENTS

| JP | 2020-58141 A | 4/2020 |
| KR | 10-2020-0041045 A | 4/2020 |
| KR | 10-2020-0144726 A | 12/2020 |

OTHER PUBLICATIONS

Yoo, Yeuntae, et al. "Dispatchable substation for operation and control of renewable energy resources." *Applied Sciences* 10.21 (Nov. 9, 2020): 7938.

(Continued)

*Primary Examiner* — Christopher E. Everett
(74) *Attorney, Agent, or Firm* — NSIP Law (57) ABSTRACT

Provided are a substation system including an energy storage device, a method of calculating capacity of the energy storage device, and a control apparatus for the same. The control apparatus may include a charge and discharge determination unit configured to determine a charge or discharge operation of an energy storage device based on whether a measured output value is within an output operation range; a forecast error determination unit configured to determine a ratio of a period in which the measured output value is out of the output operation range with respect to a total period; and a capacity determination unit configured to determine capacity of the energy storage device based on the ratio.

14 Claims, 8 Drawing Sheets

(58) Field of Classification Search
CPC ........ H02J 3/381; H02J 3/004; H02J 2300/20; G01R 31/382; G06Q 10/04; G06Q 50/06; Y02E 70/30; Y04S 10/14
See application file for complete search history.

(56) References Cited

U.S. PATENT DOCUMENTS

| | | | |
|---|---|---|---|
| 2017/0104343 A1* | 4/2017 | ElBsat | H02J 3/388 |
| 2019/0027936 A1* | 1/2019 | Kim | H02J 3/004 |
| 2020/0274357 A1* | 8/2020 | Inoue | H02J 3/16 |
| 2022/0052524 A1* | 2/2022 | Akyol | H02J 7/00712 |
| 2022/0309346 A1* | 9/2022 | Kim | G06N 3/006 |
| 2022/0376510 A1* | 11/2022 | Ramesh | H02S 10/12 |

OTHER PUBLICATIONS

Wang, Chengfu, et al. "Optimal sizing of energy storage considering the spatial-temporal correlation of wind power forecast errors." *IET Renewable Power* Generation 13.4 (Jan. 11, 2019): pp. 530-538.

Alam, M. J. E., K. M. Muttaqi, and D. Sutanto. "A novel approach for ramp-rate control of solar PV using energy storage to mitigate output fluctuations caused by cloud passing." *IEEE Transactions on Energy Conversion* 29.2 (Jun. 2014): pp. 507-518.

* cited by examiner

SUBSTATION INCLUDING ENERGY STORAGE SYSTEM, METHOD FOR ASSESSMENT OF CAPACITY OF THE SAME AND APPARATUS THEREFOR

CROSS-REFERENCE TO RELATED APPLICATIONS

This application claims the benefit under 35 USC § 119(a) of Korean Patent Application No. 10-2021-0097947 filed on Jul. 26, 2021 in the Korean Intellectual Property Office, the entire disclosure of which is incorporated herein by reference for all purposes.

BACKGROUND

1. Field

At least one example embodiment relates to a substation system including an energy storage device, a method of calculating capacity of the energy storage device, and a control apparatus for the same.

2. Description of Related Art

In general, power produced in a power plant in a typical electric power system is stepped up through a step-up substation and stepped down through a primary substation and a secondary substation and then distributed to factories or general households. For a conventional thermal power plant or nuclear power plant that produce power using fossil fuels or nuclear power, it was not difficult to constantly produce power and maintain stability of an overall system operation. Recently, due to depletion of fossil fuels, environmental issues, and doubts about safety, a renewable energy power plant is in the spotlight. However, such a renewable energy power plant may have uncertainty in forecasting an output amount. That is, a wind power plant, a solar thermal power plant, or a photovoltaic (PV) power plant is greatly affected due to an environmental condition, such as weather, which causes shortage of power supply and may deteriorate system stability. In particular, to compensate for the shortage of power supply, it is necessary to secure a certain level of reserve power. However, as the uncertainty of the output forecast increases, the need to secure excessive reserve power may also increase and effectiveness of a power system operation may significantly decrease. To solve this issue, in the recent times, an energy storage system (ESS) for saving power when the power supply is sufficient and separately supplying the power when the power supply is insufficient is additionally used. However, even with such an ESS, it is not easy to solve the issue according to the uncertainty of the renewable energy power plant. In particular, due to the uncertainty of weather change and difficulty in forecast, it was not easy to quantitatively calculate the expected effect of capacity calculation for an energy storage device. Also, an increase in penetration capacity of the renewable energy power plant and diversification of a facility installation location were aggravating the difficulty of a system operation according to an existing centralized method.

SUMMARY

At least one example embodiment provides a substation system including an energy storage device that may appropriately calculate capacity of an energy storage system (ESS) based on weather information and thereby efficiently and stably operate a system, an energy storage device capacity calculation method, and a control apparatus for the same.

To accomplish the aforementioned objective, a substation system, an energy storage device capacity calculation method, and a control apparatus for the same are provided.

According to an aspect of at least one example embodiment, there is provided a control apparatus including a charge and discharge determination unit configured to determine a charge or discharge operation of an energy storage device based on whether a measured output value is within an output operation range; a forecast error determination unit configured to determine a ratio of a period in which the measured output value is out of the output operation range with respect to a total period; and a capacity determination unit configured to determine capacity of the energy storage device based on the ratio.

According to an aspect of at least one example embodiment, there is provided a method of calculating capacity of an energy storage device, the method including determining a charge or discharge operation of the energy storage device based on whether a measured output value is within an output operation range; determining a ratio of a period in which the measured output value is out of the output operation range with respect to a total period; and determining capacity of the energy storage device based on the ratio.

According to an aspect of at least one example embodiment, there is provided a substation system including an energy storage device; and a control apparatus configured to determine a charge or discharge operation of the energy storage device based on whether a measured output value is within an output operation range, determine a ratio of a period in which the measured output value is out of the output operation range with respect to a total period, and determine capacity of the energy storage device based on the ratio.

According to the aforementioned substation system including the energy storage device, energy storage device capacity calculation method, and control apparatus for the same, it is possible to appropriately calculate capacity of an ESS based on whether information and to efficiently or stably operate, maintain, and manage a power system.

According to the aforementioned substation system including the energy storage device, energy storage device capacity calculation method, and control apparatus for the same, it is also possible to appropriately calculate minimum capacity of an ESS that may supplement the uncertainty in forecast using a correlation between a forecast accuracy and a forecast error.

According to the aforementioned substation system including the energy storage device, energy storage device capacity calculation method, and control apparatus for the same, it is possible to stabilize a voltage in a local network and support a frequency response of a network, which is similar to a synchronous generator.

According to the aforementioned substation system including the energy storage device, energy storage device capacity calculation method, and control apparatus for the same, it is possible to directly compensate for loss caused by a forecast error.

According to the aforementioned substation system including the energy storage device, energy storage device capacity calculation method, and control apparatus for the same, it is possible to integrate and operate a renewable energy generation facility and a substation based on an ESS.

According to the aforementioned substation system including the energy storage device, energy storage device capacity calculation method, and control apparatus for the same, a system operator may operate the existing facility by using the same as an intermediate linkage point for linkage of renewable power generation facility. Therefore, without a large-scale replacement and maintenance of the existing power generation facility or addition of a new facility, it is possible to conduct a hierarchical control of a system and to improve economic feasibility of a system operation.

Also, according to the aforementioned substation system including the energy storage device, energy storage device capacity calculation method, and control apparatus for the same, although capacity of a linkage point is insufficient when constructing a new renewable energy power plant, it is possible to optimally increase the linkable capacity and to reduce the uncertainty in a system supply and demand.

The aforementioned features and effects of the disclosure will be apparent from the following detailed description related to the accompanying drawings and accordingly those skilled in the art to which the disclosure pertains may easily implement the technical spirit of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Hereinafter, example embodiments of a control apparatus for maintaining, managing, and controlling an energy storage device and a substation system including the control apparatus and the energy storage device are described in detail.

Figure 1:
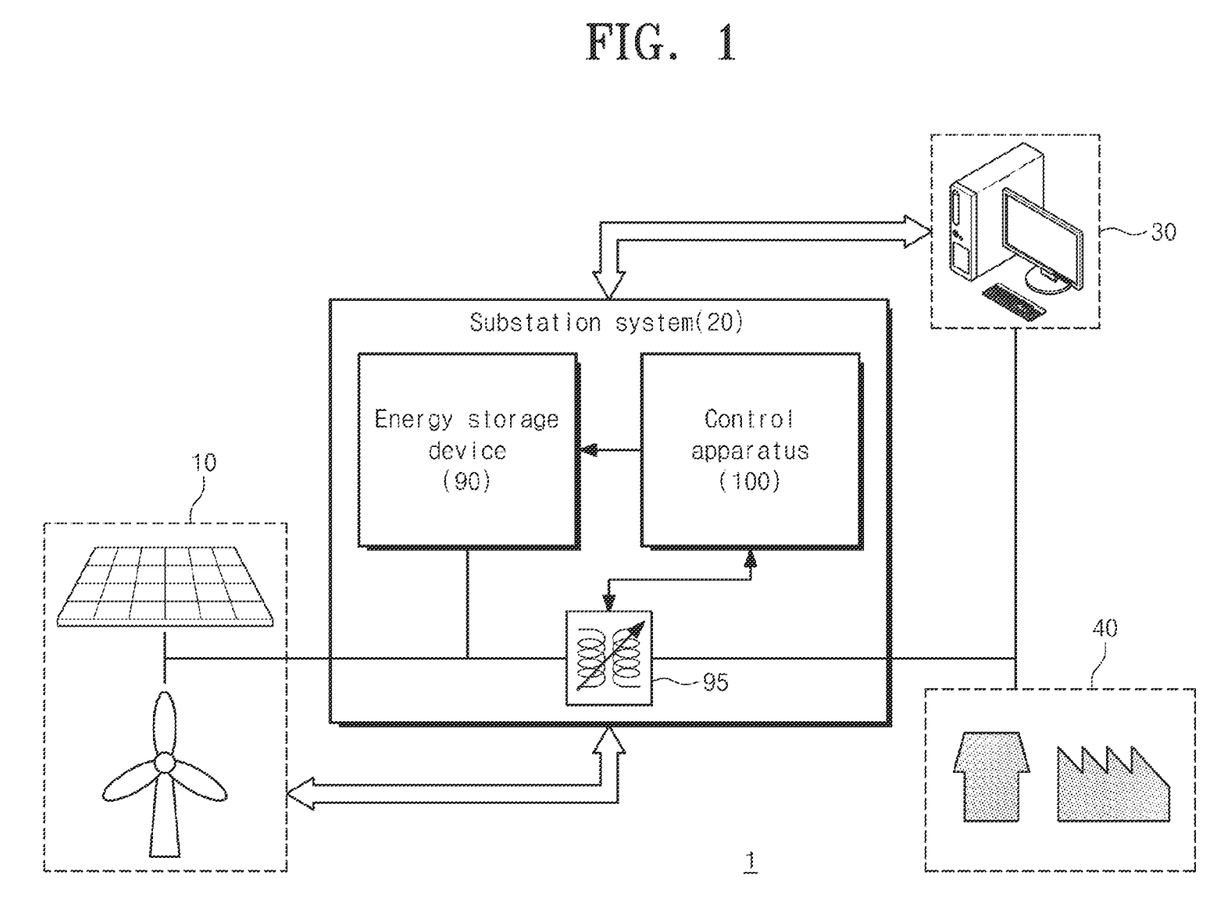
FIG. 1 illustrates an example of a substation system according to an example embodiment.

FIG. 1 illustrates an example of a substation system according to an example embodiment.

Referring to FIG. 1, a power system 1 may include a power generation source 10 configured to produce power, a substation system 20 configured to convert the power produced by the power generation source 10, a management system 30 configured to manage, maintain, control, or monitor the substation system 20, and a power consumer 40 (e.g., an area, a facility, or a device that consumes power, such as a household, a factory, a vehicle, an office building, a road transportation facility, and a charging station) configured to receive the power stepped up or stepped down by the substation system 20 through a transmission line and a distribution line.

The power generation source 10 may produce the power and may deliver the produced power to the substation system 20 directly or through another substation. The power generation source 10 may produce the power based on fossil fuels or nuclear power or may produce the power based on renewable resources. The renewable resources may include at least one of the sun (solar heat, solar irradiance, etc.), wind power, hydro power, geothermal heat, wave power, tidal power, and biofuels (biomass) and, in addition thereto, may further include resources reproduced to be recyclable over time. Depending on example embodiments, only one power generation source 10 (e.g., only one wind power generator) may be present or a plurality of power generation sources 10 (e.g., a plurality of PV power plants) may be present. When the plurality of power generation sources 10 is provided, all of the power generation sources 10 may be identical or a portion thereof may be identical and another portion thereof may be different (e.g., a plurality of wind power plants and a plurality PV power plant, etc.), or all of them may differ from each other. Depending on example embodiments, each power generation source 10 may be communicatively connected to at least one of the substation system 20 and the management system 30 through a wired/wireless communication network and may receive data or a control instruction related to an operation from at least one of the substation system 20 and the management system 30. In this case, the power generation source 10 may operate based on the received data or control instruction.

The substation system 20 may step up and/or step down the power of the power generation source 10 and may supply the stepped-up and/or stepped-down power to the power consumer 40, and if necessary, may deliver a predetermined instruction or information to the power generation source 10 or the management system 30 and/or may receive the necessary information from the power generation source 10 or the management system 30. Also, the substation system 20 may supply the necessary power even to the management system 30.

According to an example embodiment, the substation system 20 may include an energy storage device 90 and a control apparatus 100.

Figure 2:
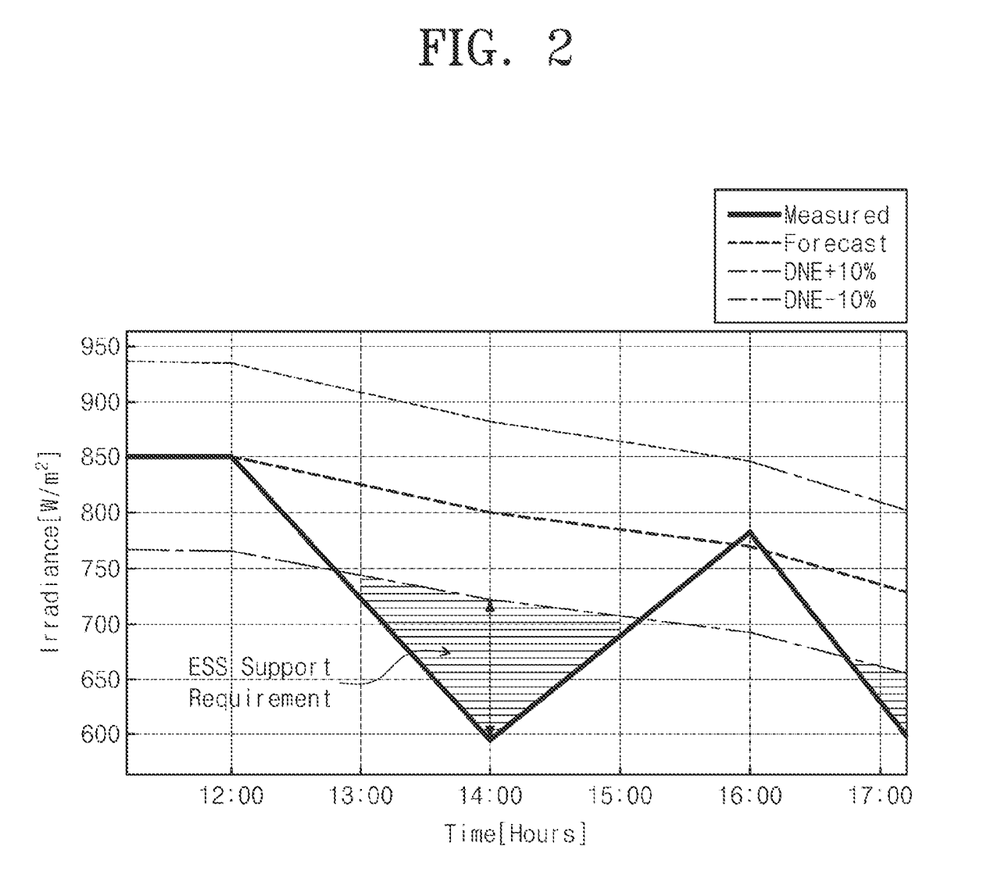
FIG. 2 is a graph showing necessity of an energy storage device according to an example embodiment.

FIG. 2 is a graph showing necessity of an energy storage device according to an example embodiment. In FIG. 2, the x axis denotes time and the y axis denotes an amount of incident sunlight. A bold solid line denotes an actual measured amount of sunlight and a dotted line in a middle portion denotes a forecast amount of sunlight. An alternated long and short dash line in an upper portion denotes an upper limit value (a forecast value plus 10%) of the allowable range of an actual measured output value for a forecast output value, and an alternated long and short dash line in a lower portion denotes a lower limit value (a forecast value minus 10%) of the allowable range of the actual measured output value for the forecast output value. The upper limit value and the lower limit value may be preset by an administrator using the management system 30.

The energy storage device 90 may be configured to store the power produced by the power generation source 10 and, if necessary, to discharge the charged power and to supply the same to the management system 30 or the power consumer 40. According to the energy storage device 90, it is possible to supplement the uncertainty in an amount of power generation by a power plant based on renewable energy. In detail, the renewable energy may be greatly affected by a surrounding environment (e.g., a location or a shape of cloud). Such an environmental change is not easy to forecast. Therefore, for example, referring to FIG. 2, an amount of light incident to a solar panel of a photovoltaic (PV) power plant may decrease to be different from forecast and may be less than the lower limit value for a certain period (e.g., between 13:00 and 15:00). In this case, an amount of power generation by the PV power plant is bound to be much less than an expected amount of power generation. Therefore, power to be supplied to the power consumer 40 becomes insufficient. The energy storage device 90 may perform a discharge operation at a point in time at which an amount of power is insufficient and may supply the previously charged electrical energy to the power consumer 40, thereby solving a power shortage issue. The energy storage device 90 may include an energy storage system (ESS). The ESS may be implemented using a lithium battery, a sodium sulfur (NaS) battery, a redox flow battery (RFB), or a supercapacitor, may be implemented using a pumping-up power generation, or may be implemented using a compressed air energy storage ESS (CAES) or a flywheel.

Figure 3:
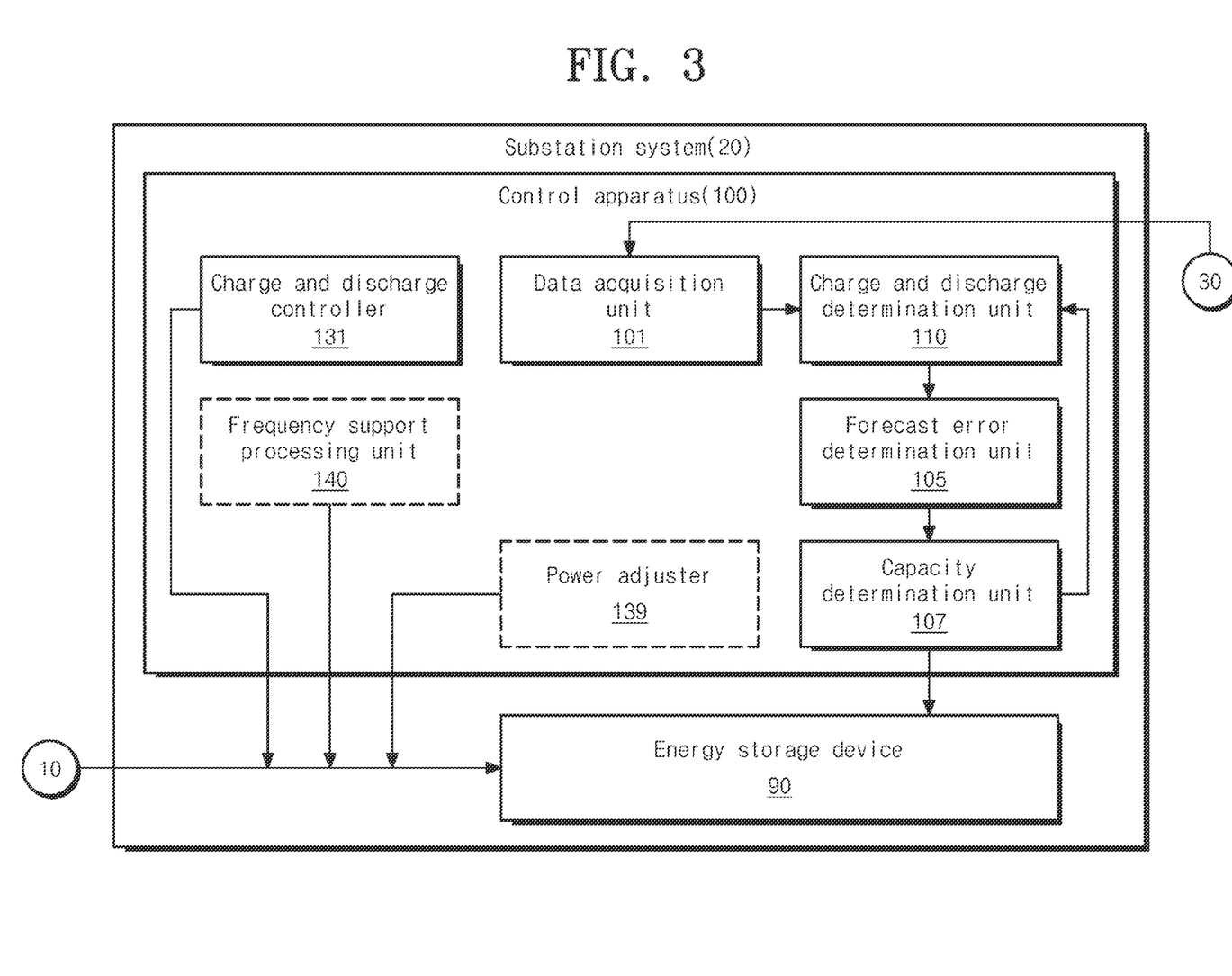
FIG. 3 is a diagram illustrating an example of an energy storage device and a control apparatus for the same according to an example embodiment.

FIG. 3 is a diagram illustrating an example of an energy storage device and a control apparatus for the same according to an example embodiment.

The control apparatus 100 may control one or at least two operations of the substation system 20. For example, the control apparatus 100 may control or manage an operation (e.g., a charge operation or a discharge operation) of the energy storage device 90. Also, the control apparatus 100 may receive an instruction or data (a setting value) delivered from the management system 30 and, based thereon, may control or manage an operation or a state of the energy storage device 90. The control apparatus 100 may be implemented based on a single physical device or may be implemented by combining at least two separate physical devices. For example, the control apparatus 100 may be implemented by combining a remote terminal unit (RTU) and at least one another semiconductor processing device connected to the RTU through a circuitry, a cable, or a wireless communication network.

Referring to FIG. 3, according to an example embodiment, the control apparatus 100 may include a data acquisition unit 101, a charge and discharge determination unit 110, a forecast error determination unit 105, and a capacity determination unit 107, and if necessary, may further include at least one of a charge and discharge controller 131, a power adjuster 139, and a frequency support processing unit 140. At least one of the aforementioned components may be omitted depending on example embodiments.

The data acquisition unit 101 may acquire at least one necessary instruction or information from the power generation source 10 or the management system 30. For example, referring to FIG. 2, the data acquisition unit 101 may receive the allowable range of an actual measured output value for a forecast output value. The allowable range may be referred to as an upper limit value or a lower limit value (e.g., a Do Not Exceed (DNE) limit) for an output value. Here, if an actual output value exceeds a DNE upper limit value or falls shorts of a DNE lower limit value, a system operator may impose violation penalty, such as money and the like, on a business owner/operator of the power generation source 10. Also, the data acquisition unit 101 may receive and acquire forecast information on the weather (e.g., forecast for an amount of sunlight, forecast for a wind direction or a wind speed, etc.), a refresh cycle (e.g., about 15 minutes), a curtailment instruction and/or data or instruction related to reactive power from the management system 30. According to an example embodiment, the data acquisition unit 101 may also acquire information or an instruction with the management system 30 using a Supervisory Control And Data Acquisition (SCADA).

Figure 4:
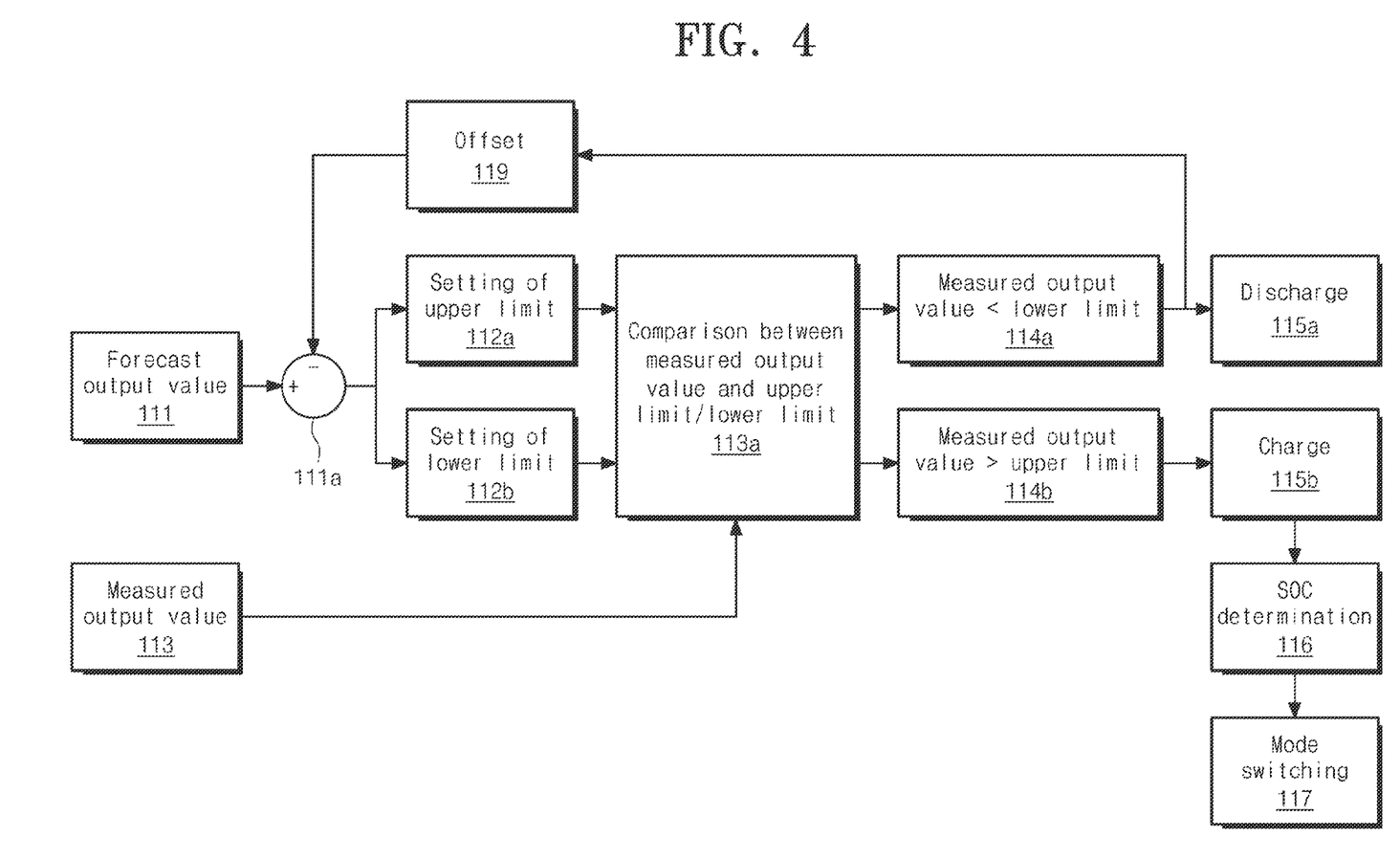
FIG. 4 illustrates an example of a process of determining a charge and discharge operation of an energy storage device in a charge mode according to an example embodiment.
Figure 5:
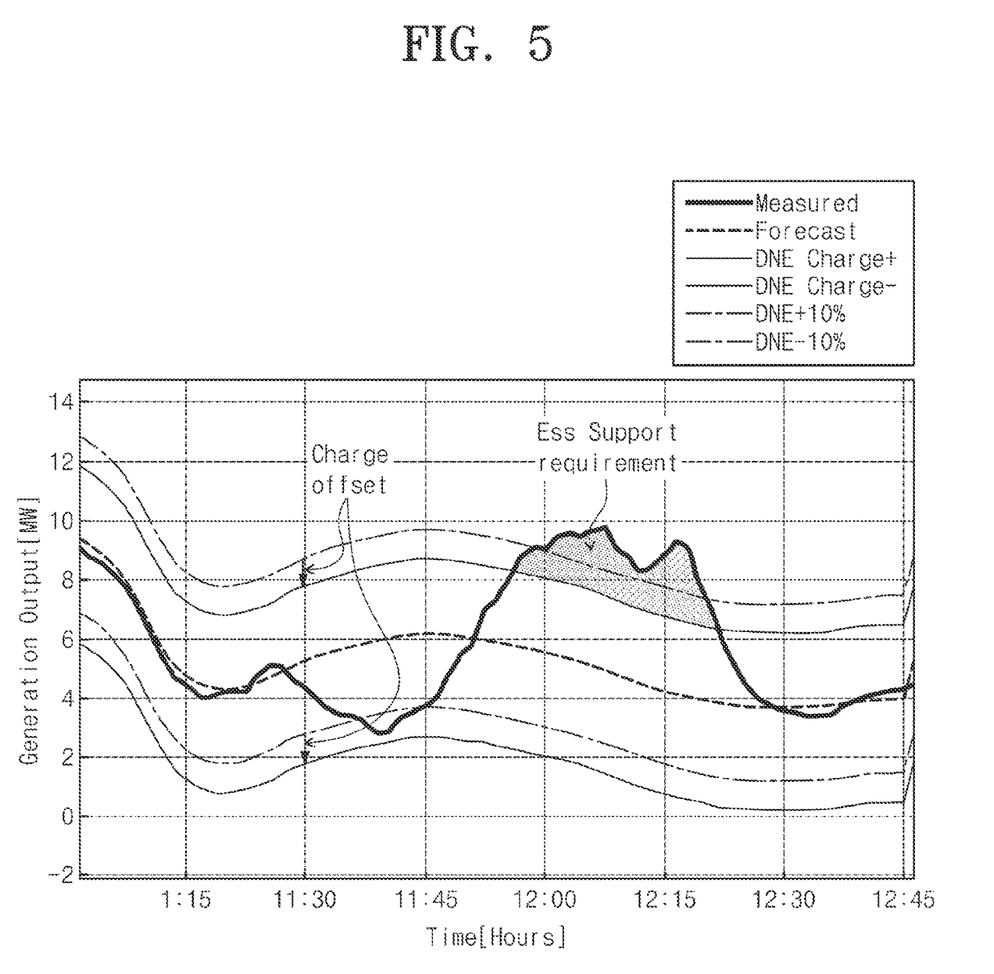
FIG. 5 is a graph showing an example of a charge operation of an energy storage device by a control apparatus according to an example embodiment.

FIG. 4 illustrates an example of a process of determining a charge and discharge operation of an energy storage device in a charge mode according to an example embodiment, and FIG. 5 is a graph showing an example of a charge operation of an energy storage device by a control apparatus according to an example embodiment. In FIG. 5, the x axis denotes time and the y axis denotes an output of the power generation source 10. A bold solid line denotes a measured output, a dotted line in a middle portion denotes a forecast output, an alternated long and short dash line in an upper portion denotes an upper limit and an alternated long and short dash line in a lower portion denotes a lower limit. The alternated long and short dash lines in the upper portion and the lower portion represent the upper limit and the lower limit corrected by adding offset, respectively.

The charge and discharge determination unit 110 may determine a mode (i.e., a charge mode or a discharge mode) in which the energy storage device 90 is to operate depending on whether an actual measured output value (power) is within an output operation range. For example, referring to FIGS. 4 and 5, when the energy storage device 90 currently operates in the charge mode (i.e., when the energy storage device 90 is being charged or in a chargeable state), the charge and discharge determination unit 110 may set two limit values (i.e., an upper limit value and a lower limit value for an actual measured output value 113 based on a forecast output value 111 for an output value (112a and 112b). Setting of the upper limit value and the lower limit value may be performed based on information received from the management system 30. Here, for example, as shown in FIG. 2 or FIG. 5, the upper limit value and the lower limit value may be given as a value acquired by adding a predetermined ratio (e.g., 10%) to the forecast output value 111 and a value acquired by subtracting the predetermined ratio (e.g., 10%) from the forecast output value 111, respectively. However, the upper limit value and the lower limit value may be variously defined based on an arbitrary determination of a designer or a user. Also, the value added to the forecast output value 111 or the value subtracted therefrom may be identical to each other or differ from each other. The output operation range may be given by the set upper limit value and lower limit value. Subsequently, comparison between the measured output value 113 and the upper limit value may be performed and/or comparison between the measured output value 113 and the lower limit value may be performed through a separately provided power measurement device (not shown) (113a). The measured output value 113 may be acquired through the management system 30 periodically (e.g., approximately every 15 minutes) and, in response thereto, comparison between upper limit/lower limit and the measured output value 113 may be periodically performed. If the measured output value 113 is less than the set lower limit value (114a) as a result of comparison, that is, if the measured output value 113 is out of a defined range (e.g., a range of 10% above and below based on a predefined error range (e.g., the forecast output value 111), the charge and discharge determination unit 110 determines the energy storage device 90 to operate in a discharge mode (115a). Therefore, the energy storage device 90 may output the power to an outside under control of the charge and discharge controller 131 and the power may be supplied to the power supplier 40. On the contrary, if the measured output value 113 is greater than the upper limit value (114b), that is, if the measured output value 113 exceeds the predefined error range, the energy storage device 90 determines the energy storage device 90 to continuously operate in the charge mode (115b). If a state of charge (SOC) of the energy storage device 90 reaches a target state (116), the energy storage device 90 may be determined by the charge and discharge determination unit 110 to operate not in the charge mode but in the discharge mode. The energy storage device 90 may terminate a charge operation and may initiate a discharge operation under control of the charge and discharge controller 131 (117). According to an example embodiment, referring to FIGS. 4 and 5, although the actual measured output value 113 is less than the forecast output value 111, at least one of the upper limit value and the lower limit value may be determined by further adding or subtracting a predetermined offset 119 with respect to at least one of the upper limit value and the lower limit value to enable a correction through a charge operation. For example, if an offset is subtracted, the upper limit value and the lower limit value may be relatively lower as illustrated in FIG. 5. If the offset is applied and controlled, the energy storage device 90 may operate in the charge mode even in a section in which the energy storage device 90 operates in the discharge mode (e.g., a section between about 11:37 and 11:45 in FIG. 5) when the offset is not applied. Therefore, it is possible to correct an amount of power generation lower than an actual output forecast by reducing charge capacity of the energy storage device 90 being charged at all times.

Figure 6:
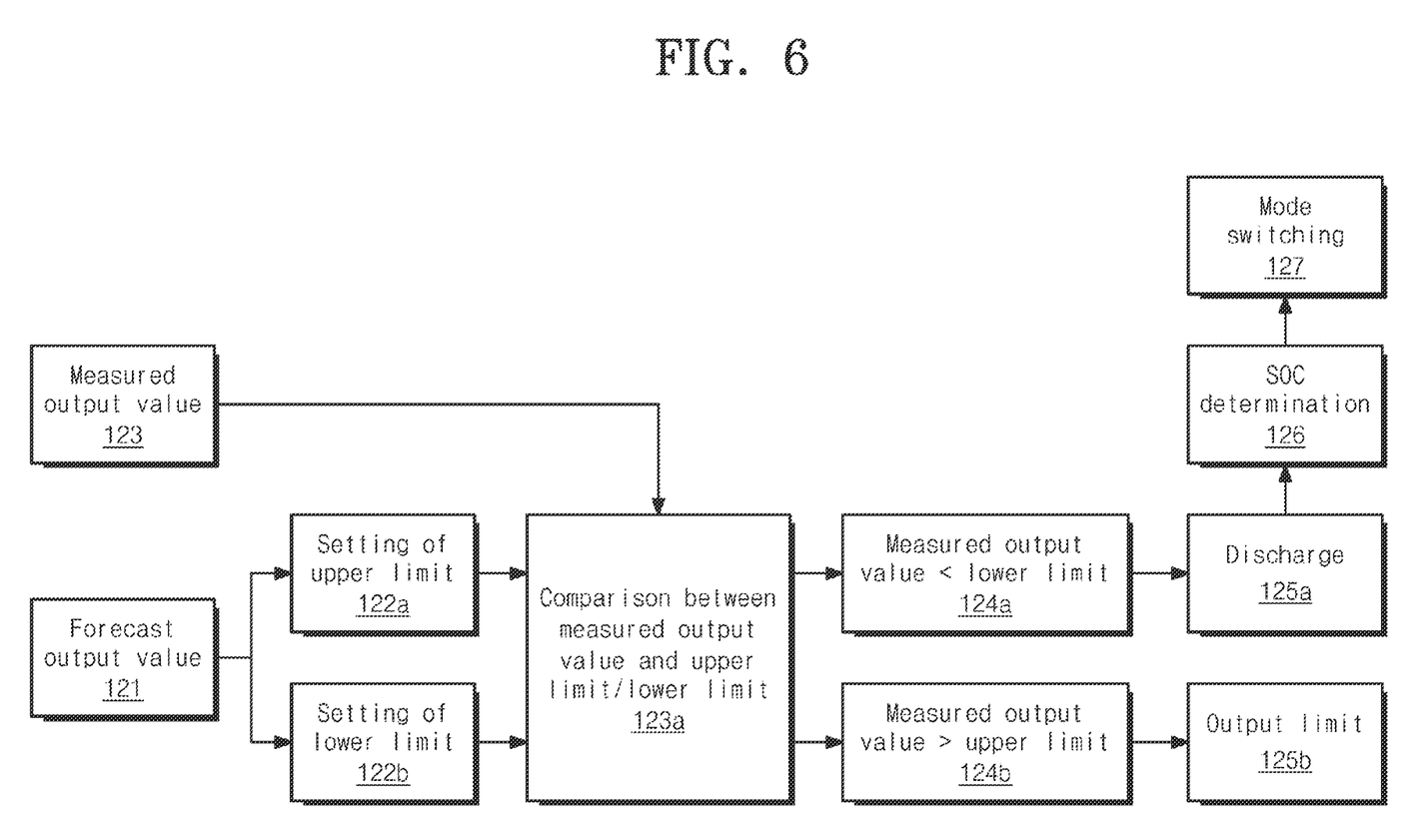
FIG. 6 illustrates an example of a process of determining a charge and discharge operation of an energy storage device in a discharge mode according to an example embodiment.

FIG. 6 illustrates an example of a process of determining a charge and discharge operation of an energy storage device in a discharge mode according to an example embodiment.

Figure 7:
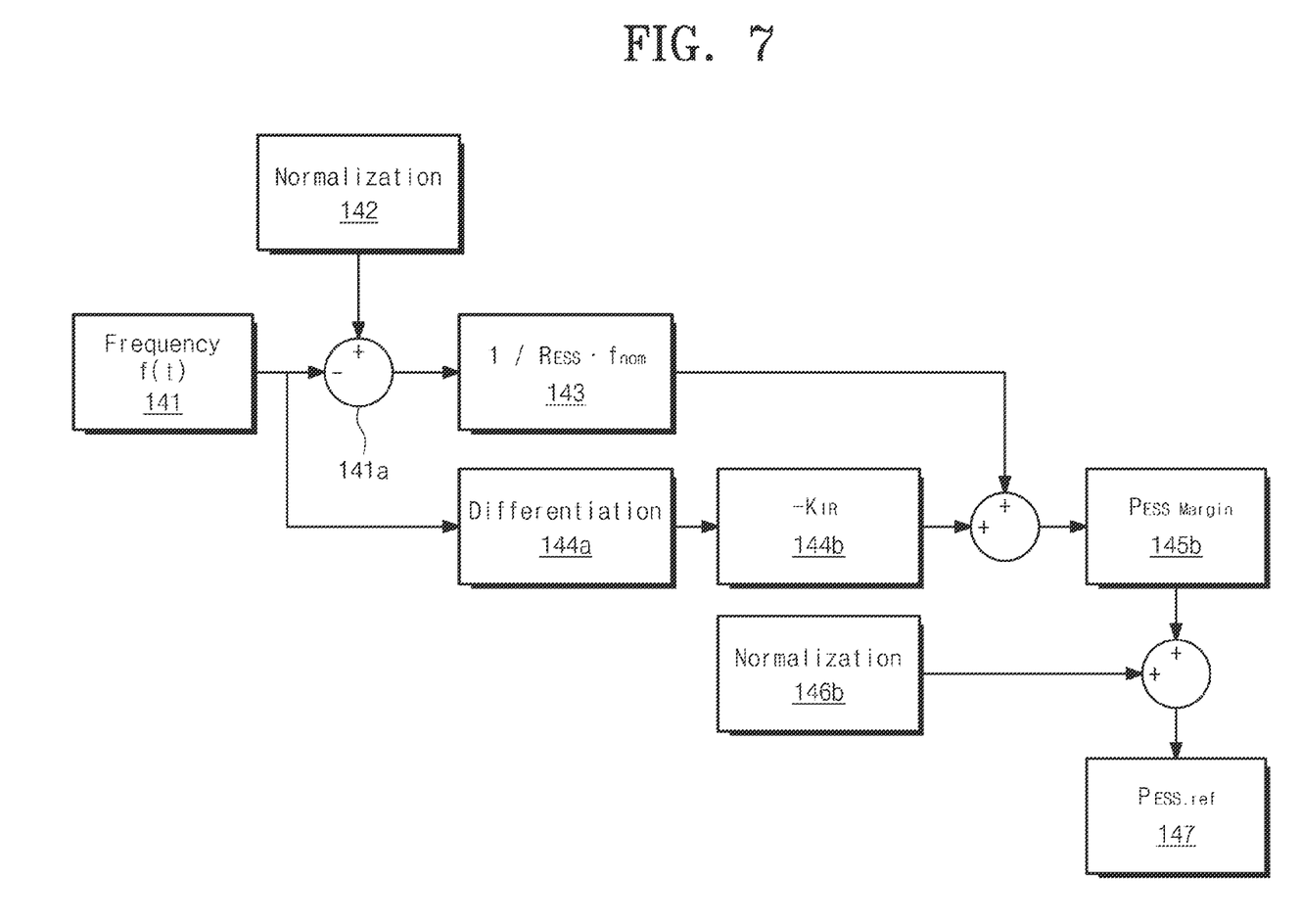
FIG. 7 illustrates an example of an operation of a frequency support processing unit according to an example embodiment.

On the contrary to the aforementioned description, referring to FIGS. 5 and 7, when the energy storage device 90 operates in the discharge mode (e.g., in a state in which the energy storage device 90 is supplying the power to the power system 1), the charge and discharge determination unit 110 may set the upper limit value and the lower limit value for a given forecast output value 121 (122a and 122b), and may perform comparison between an actual measured output value 123 (as described above, periodically acquirable) and the upper limit value and may perform comparison between the actual measured output value 123 and the lower limit value (123a). If the measured output value 123 is less than the lower limit value (124a), an operating mode of the energy storage device 90 may be determined and maintained as the discharge mode and the energy storage device 90 may continuously perform a discharge operation. If an SOC reaches a target SOC set by a user or a designer (126), the charge and discharge determination unit 110 may determine the energy storage device 90 to operate in the charge mode. In this case, the energy storage device 90 terminates the discharge operation and initiates the charge operation under control of the charge and discharge controller 131. Meanwhile, if the actual measured output value 123 exceeds the set upper limit value (124b), output limitation for the power generation source 10 is determined (125b). The control apparatus 100 may deliver output limit command/information to the power generation source 10 through a wired or wireless communication network and, in response thereto, the power generation source 10 may perform an output limiting operation.

The forecast error determination unit 105 may acquire a ratio of a period (hereinafter, an error occurrence period) in which the actual measured output value 113, 123 is out of the predetermined range (i.e., upper limit and lower limit) and may compare the acquired ratio to a predefined target allowable ratio. The target allowable ratio represents a ratio of a period in which the actual measured output value 113, 123 allowable for the total period is out of the output operation range. In detail, the forecast error determination unit 105 may determine a ratio of an error occurrence period to a total period by summing the error occurrence period (i.e., a period in which the measured output value 113, 123 exceeds the upper limit or falls below the lower limit) and by dividing a summation result by the total period and may compare the determined ratio to the target allowable ratio. A comparison result may be delivered to the capacity determination unit 107.

The capacity determination unit 107 may determine capacity of the energy storage device 90 based on the ratio of the error occurrence period to the total period. If the ratio of the error occurrence period to the total period exceeds the target allowable ratio, the capacity determination unit 107 may determine the capacity of the energy storage device 90 to increase, which may be represented as the following Equation 1.

$$\frac{CT_{error}}{CT_{total}} > E_{target} \quad \text{[Equation 1]}$$

In Equation 1, CT_error denotes a cumulative total period in which the actual measured output value 113, 123 is out of the output operation range during an operation using the given forecast output value 111, 121, and CT_total denotes a total period operated based on the given forecast output value 111, 121. E_target denotes the target allowable ratio.

If the capacity of the energy storage device 90 increases, the charge and discharge determination unit 110 may compare again the upper limit and the lower limit determined based on the forecast output value 111, 113 to the actual measured output value 113, 123 and may determine whether to perform the charge operation, the discharge operation, or the output limiting operation based on the comparison result, which is described above with reference to FIGS. 4 to 6. The forecast error determination unit 105 may acquire again the error occurrence period according to an operation of the charge and discharge determination unit 110 and may determine the ratio of the error occurrence period to the total period based on the acquired error occurrence period and then deliver the determined ratio to the capacity determination unit 107. The capacity determination unit 107 may determine again whether the ratio of the error occurrence period to the total period exceeds the target allowable ratio. This process may be repeatedly performed until the ratio of the error occurrence period to the total period becomes less than the target allowable ratio. Depending on example embodiments, the aforementioned process may be terminated even when the ratio of the error occurrence period to the total period is equal to the target allowable ratio. If the ratio of the error occurrence period to the total period is less than the target allowable ratio (if they are equal depending on example embodiments), the capacity determination unit 107 may determine final capacity of the energy storage device 90. Therefore, appropriate capacity of the energy storage device 90 may be calculated in response to a change in the production volume of the power generation source 10.

The charge and discharge controller 131 may control an operation of the energy storage device 90 such that the energy storage device 90 may store the power supplied from the power generation source 10 and/or may supply the stored power to the power consumer 40. For example, the charge and discharge controller 131 may control the energy storage device 90 to store peak power at a predetermined point in time or to supply the stored power during a time in which power demand is high based on time shifting technology and/or may alleviate fluctuations of PV power generation by optimizing the storage capacity of the energy storage device 90 through a ramp rate control.

The power adjuster 139 may adjust power (i.e., reactive power) lost in a power transmission and distribution process in real time to eliminate or prevent a sudden rise or a sudden drop in voltage in the power system 1, thereby maintaining the voltage within the power system 1 to be stable and approximately constant. Although the power adjuster 139 may be implemented using a static synchronous compensator (STATCOM), it is provided as an example only. If necessary, the power adjuster 139 may be omitted.

FIG. 7 illustrates an example of an operation of a frequency support processing unit according to an example embodiment.

Figure 8:
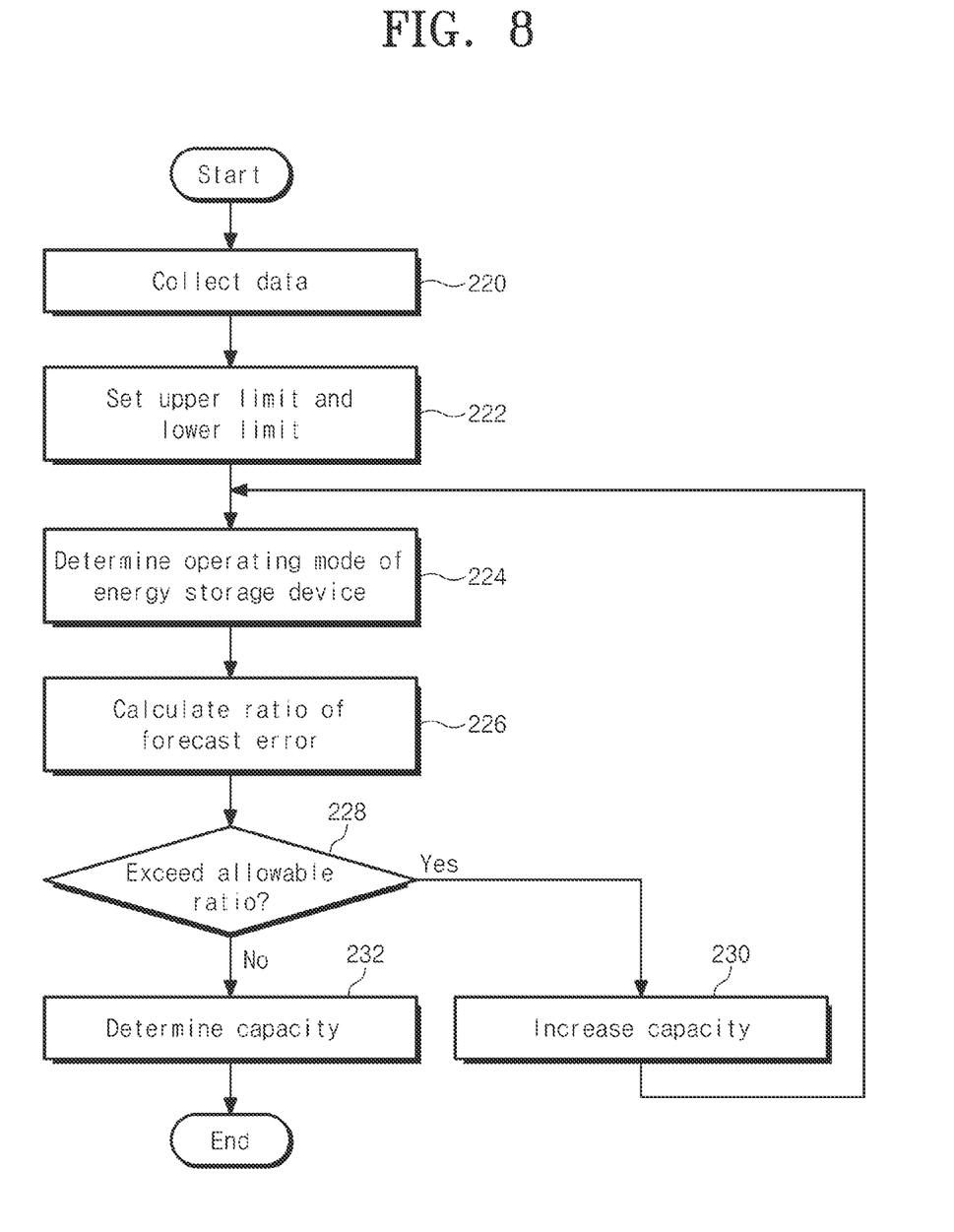
FIG. 8 is a flowchart illustrating an example of an energy storage device capacity calculation method according to an example embodiment.

When an accident occurs or a supply-demand imbalance occurs in the power system 1, the frequency support processing unit 140 may perform a control operation on the energy storage device 90 for frequency support. For example, the frequency support processing unit 140 may perform a frequency support control for the energy storage device 90 based on at least one of a droop control and an inertia control. For example, the frequency support processing unit 140 may perform a frequency mitigation through supply or absorption of the active power. Referring to FIG. 8, when a frequency 141 is input and, if necessary, a normalization 142 on the frequency 141 is performed, an Inverse number of a product between the normalized frequency and a droop response (R_ESS) of the substation system 20 is acquired (143). The droop response (R_ESS) of the substation system 20 makes an active power response of the energy storage device 90 proportional to a frequency deviation. Meanwhile, the frequency 141 is used to calculate a variance over time (df/dt) (144a) and a coefficient (K_IR) related to the inertia response according to generation of the response is acquired. The inertia response is proportional to a derivative value of the frequency. The inverse number of the product between the frequency and the droop response (R_ESS) and the coefficient (K_IR) related to the inertia response are merged and a result value (P_ESS.Margin) according thereto is acquired. After a normalization 146b for the result value (P_ESS.Margin) is performed (146a), a final result value (P_ESS.ref) is acquired (147). Accordingly, synthetic inertia for the power system 1 may be generated and a ratio of change of frequency may be mitigated. If necessary, the frequency support processing unit 140 may be omitted.

The management system 30 may be configured to deliver data or a command in a one-way or two-way manner through a wired or wireless communication network with the substation system 20 such that a user, for example, a transmission system operator (TSO), may manage, maintain, control, or monitor an operation of the substation system 20. The management system 30 may also perform a management or a control of the substation system 20 based on SCADA. If necessary, the management system 30 may receive data or a command from the user and may also visually or auditorily provide the user with information (e.g., an operation state (e.g., a power generation status or an output limiting status) of the power generation source 10, an operation state (a charge or discharge status) or an operation change status of the energy storage device 90 and/or a charge level of the energy storage device 90) acquired from the power generation source 10 or the substation system 20. The management system 30 may be implemented using a device specially designed to perform the aforementioned operation or may be implemented using one known information processing device alone or at least two known information processing devices in combination. Here, the information processing device may include a desktop computer, a hardware device for server or a portable terminal device (e.g., a laptop computer and a smartphone), but is not limited thereto.

Hereinafter, an example embodiment of an energy storage device capacity calculation method is described with reference to FIG. 8.

FIG. 8 is a flowchart illustrating an example of an energy storage device capacity calculation method according to an example embodiment.

Referring to FIG. 8, in operation 220, a control apparatus may acquire forecast data (i.e., forecast data related to weather and a power volume estimated to be produced by a power generation source according to a change in the weather), an allowable range of an output value, a refresh period, an output limit instruction and/or data or an instruction related to active power. Also, the control apparatus may measure and acquire power (i.e., an actual measured output value) delivered from a power generation source. Here, the control apparatus may be configured to manage or control an energy storage device and may be included in a substation system. The acquired data or instruction may be delivered from a management system and/or may be delivered from the power generation source. The control apparatus may acquire the aforementioned data or instruction by communicating with the management system through SCADA and the like.

In operation 222, the control apparatus may set a limit value (e.g., at least one of an upper limit value and a lower limit value. The limit value may be determined based on a reference value. For example, the upper limit value may be determined as a value acquired by adding a predetermined ratio (e.g., 10%) to the reference value and the lower limit value may be determined as a value acquired by subtracting a predetermined ratio (e.g., 10%) from the reference value. Also, depending on example embodiments, the upper limit value may be determined by adding the predetermined ratio to the reference value and by adding or subtracting a predetermined offset thereto or therefrom, and the lower limit value may be determined by subtracting the predetermined ratio from the reference value and by adding or subtracting the predetermined offset thereto or therefrom. In addition, the upper limit value and the lower limit value may be determined using more various methods according to the designer or the user.

In operation 224, an operating mode of the energy storage device may be determined depending on whether the actual measured output value is within the range (i.e., the allowable range) of the calculated upper limit value and lower limit value. That is, whether the energy storage device operates in a charge mode to charge the power supplied from the power generation source or whether the energy storage device operates in a discharge mode to output the prestored power to an outside may be determined. In detail, when the energy storage device operates in the charge mode at a corresponding point in time, if the actual measured output value is less than the lower limit value as a result of comparison between the actual measured output value and the lower limit value, the operating mode of the energy storage device is determined as the discharge mode. If the actual measured output value is greater than the upper limit value as a result of comparison between the actual measured output value and the upper limit value, the operating mode of the energy storage device is determined as the charge mode. Therefore, in response thereto, the energy storage device is controlled to perform the discharge operation or continuously operate in the charge mode. Meanwhile, when the energy storage device operates in the discharge mode at the corresponding point in time, if the actual measured output value is less than the lower limit value as a result of comparison between the actual measured output value and the lower limit value, the operating mode of the energy storage device is determined as the discharge mode and the energy storage device continuously performs the discharge operation. In this case, if the actual measured output value is greater than the upper limit value as a result of comparison between the actual measured output value and the upper limit value, the power generation source may be determined to perform an output limiting operation. The aforementioned process for determination of the operation mode and the operation of the energy storage device corresponding thereto may be continuously performed during a predetermined period of time.

In operation 226, a ratio of a period in which the actual measured output value is out of the defined upper limit value and lower limit value with respect to a total period in the aforementioned process for determination of the operation mode and the operation of the energy storage device may be calculated according to a predefined setting (e.g., elapse of a predetermined period of time) or a manual manipulation of the user. In detail, the ratio of the error occurrence period to the total period may be determined by summing all the periods (i.e., error occurrence periods) each in which the actual measured output value exceeds the upper limit or falls below the lower limit and by dividing a summation result by the total period.

In operation 228, the calculated ratio may be compared to the target allowable ratio preset by the designer or the user.

If the ratio of the error occurrence period to the total period is greater than the target allowable ratio (yes in operation 228), the control apparatus may determine the capacity of the energy storage device to increase in operation 230. The aforementioned operation 224 of determining the operating mode of the energy storage device, operation 226 of calculating the ratio of the period in which the actual measured output value is out of the defined upper limit value and lower limit value with respect to the total period, and operation 228 of comparing between the calculated ratio and the target allowable ratio may be repeatedly performed.

On the contrary, if the ratio of the error occurrence period to the total period is less than the target allowable ratio (no in operation 228), the control apparatus may determine final capacity of the energy storage device in operation 232. Therefore, the final capacity of the energy storage device according to the power generation source may be determined.

The energy storage device capacity calculation method according to the example embodiments may be implemented in a form of a program executable by a computer apparatus. The program may include, alone or in combination with instructions, libraries, data files, and/or data structures. The program may be designed and produced using a machine language code or a high-level language code. The program may be specially designed to implement the aforementioned methods and may be implemented using various types of functions or definitions known and available to those skilled in the art in the computer software arts. Also, here, the computer apparatus may be implemented by including a processor or a memory that enables functions of the program and, if necessary, may further include a communication apparatus. Also, the program to implement the storage device capacity calculation method may be recorded in non-transitory computer-readable recording media. The media may include, for example, a semiconductor storage device such as a solid state drive (SSD), read only memory (ROM), read access memory (RAM), and a flash memory, magnetic disk storage media such as hard disks and floppy disks, optical media such as compact discs and DVDs, magneto-optical media such as floptical disks, and at least one physical device configured to store a specific program executed according to a call of a computer and the like, such as magnetic tapes.

Although example embodiments of a substation system including an energy storage device, an energy storage device capacity calculation method, and a control apparatus for the same are described, the substation system, the energy storage device capacity calculation method, or the control apparatus for the same is not limited to the aforementioned example embodiments. Various systems, facilities, apparatuses, or methods implemented by those skilled in the art through modifications and alterations based on the aforementioned example embodiments also belong to an example embodiment of the aforementioned substation system, energy storage device capacity calculation method, or control apparatus for the same. For example, although the aforementioned method(s) are performed in order different from the aforementioned description and/or component(s), such as systems, structures, apparatuses, and circuits, are coupled, connected, or combined in a different form or replaced or substituted with another component or equivalent, it may also correspond to an example embodiment of the aforementioned substation system, energy storage device capacity calculation method, or control apparatus for the same.

What is claimed is:

1. A control apparatus implemented in hardware comprising at least one processor and configured to:
    determine a charge or discharge operation of an energy storage device based on whether a measured output value of the energy storage device is within an output operation range;
    determine a ratio of an error occurrence period in which the measured output value is outside the output operation range to a total period; and
    determine capacity of the energy storage device based on the ratio of the error occurrence period to the total period,
    wherein the control apparatus is further configured to increase the capacity of the energy storage device when the ratio exceeds a target allowable ratio.

2. The control apparatus of claim 1, wherein the control apparatus is configured to:
    determine an upper limit value and a lower limit value based on a forecast output value,
    compare the measured output value to each of the upper limit value and the lower limit value, and
    determine the charge or discharge operation of the energy storage device based on a comparison result.

3. The control apparatus of claim 2, wherein the control apparatus is configured to:
    determine the energy storage device to operate in a discharge mode when the energy storage device operates in a charge mode and the measured output value is less than the lower limit value, or determine the energy storage device to continuously operate in the charge mode when the energy storage device operates in the charge mode and the measured output value is greater than the upper limit value.

4. The control apparatus of claim 3, wherein the control apparatus is configured to determine the energy storage device to operate in the discharge mode when a state of charge (SOC) of the energy storage device reaches a target state.

5. The control apparatus of claim 3, wherein the control apparatus is configured to:
determine the energy storage device to continuously operate in the discharge mode when the energy storage device operates in the discharge mode and the measured output value is less than the lower limit value, or
determine a power generation source connected to the energy storage device to perform an output limiting operation when the energy storage device operates in the discharge mode and the measured output value is greater than the upper limit value.

6. The control apparatus of claim 1, wherein the control apparatus is configured to adjust power lost in a power transmission and distribution process in real time.

7. The control apparatus of claim 1, wherein the control apparatus is configured to perform a frequency support control for the energy storage device based on at least one of a droop control and an inertia control.

8. A method of calculating capacity of an energy storage device, the method comprising:
determining a charge or discharge operation of the energy storage device based on whether a measured output value of the energy storage device is within an output operation range;
determining a ratio of an error occurrence period in which the measured output value is outside the output operation range to a total period; and
determining capacity of the energy storage device based on the ratio of the error occurrence period to the total period,
wherein the determining of the capacity of the energy storage device based on the ratio comprises increasing the capacity of the energy storage device when the ratio exceeds a target allowable ratio.

9. The method of claim 8, wherein the determining of the charge or discharge operation of the energy storage device comprises:
determining an upper limit value and a lower limit value based on a forecast output value;
comparing the measured output value to each of the upper limit value and the lower limit value; and
determining the charge or discharge operation of the energy storage device based on a comparison result.

10. The method of claim 9, wherein the determining of the charge or discharge operation of the energy storage device based on the comparison result comprises at least one of:
determining the energy storage device to operate in a discharge mode when the energy storage device operates in a charge mode and the measured output value is less than the lower limit value; and
determining the energy storage device to continuously operate in the charge mode when the energy storage device operates in the charge mode and the measured output value is greater than the upper limit value.

11. The method of claim 10, wherein the determining of the charge or discharge operation of the energy storage device based on the comparison result comprises determining the energy storage device to operate in the discharge mode when a state of charge (SOC) of the energy storage device reaches a target state.

12. The method of claim 9, wherein the determining of the upper limit value and the lower limit value based on the forecast output value comprises:
determining an upper limit value and a lower limit value of an allowable range based on the forecast output value; and
determining the upper limit value and the lower limit value to be compared to the measured output value by adding or subtracting a predetermined offset to or from the upper limit value and the lower limit value of the allowable range.

13. The method of claim 9, wherein the determining of the charge or discharge operation of the energy storage device based on the comparison result comprises at least one of:
determining the energy storage device to continuously operate in the discharge mode when the energy storage device operates in the discharge mode and the measured output value is less than the lower limit value; and
determining a power generation source connected to the energy storage device to perform an output limiting operation when the energy storage device operates in the discharge mode and the measured output value is greater than the upper limit value.

14. A substation system comprising:
an energy storage device; and
a control apparatus configured to:
determine a charge or discharge operation of the energy storage device based on whether a measured output value of the energy storage device is within an output operation range;
determine a ratio of an error occurrence period in which the measured output value is outside the output operation range to a total period; and
determine capacity of the energy storage device based on the ratio of the error occurrence period to the total period,
wherein the control apparatus is further configured to increase the capacity of the energy storage device when the ratio exceeds a target allowable ratio.

* * * * *